United States Patent
Kris

(10) Patent No.: US 9,356,613 B1
(45) Date of Patent: May 31, 2016

(54) PULSE DENSITY MODULATION DIGITAL-TO-ANALOG CONVERTER WITH TRIANGLE WAVE GENERATION

(71) Applicant: Microchip Technology Incorporated, Chandler, AZ (US)

(72) Inventor: Bryan Kris, Gilbert, AZ (US)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 0 days.

(21) Appl. No.: 14/538,036

(22) Filed: Nov. 11, 2014

(51) Int. Cl.
   *H03M 1/66* (2006.01)
   *H03M 1/06* (2006.01)
   *H03K 4/06* (2006.01)

(52) U.S. Cl.
   CPC ............ *H03M 1/0626* (2013.01); *H03K 4/06* (2013.01); *H03M 1/66* (2013.01)

(58) Field of Classification Search
   CPC ... H03M 1/0626; H03M 1/504; H03M 1/066; H03M 1/822; H03M 3/50; H03K 4/06; H03K 7/08
   USPC ......................... 341/143, 144, 166
   See application file for complete search history.

(56) References Cited

U.S. PATENT DOCUMENTS

| | | | |
|---|---|---|---|
| 3,689,914 A | 9/1972 | Butler | 341/147 |
| 4,646,321 A * | 2/1987 | Berlinsky | H03K 7/08 332/109 |
| 5,525,874 A | 6/1996 | Mallarapu et al. | 318/400.13 |
| 6,281,822 B1 | 8/2001 | Park | 341/144 |
| 6,317,067 B1 | 11/2001 | Mohindra | 341/145 |
| 6,459,398 B1 | 10/2002 | Gureshnik et al. | 341/144 |
| 6,489,909 B2 | 12/2002 | Nakao et al. | 341/144 |
| 6,606,044 B2 | 8/2003 | Roeckner et al. | 341/143 |
| 9,048,863 B2 | 6/2015 | Kris et al. | |
| 2006/0197720 A1 | 9/2006 | De Oto et al. | 345/46 |
| 2006/0233234 A1 | 10/2006 | Lim | 375/239 |
| 2008/0180299 A1 * | 7/2008 | Forejt | H03M 1/504 341/166 |
| 2008/0309534 A1 * | 12/2008 | Baker | G11C 7/02 341/143 |
| 2011/0050467 A1 * | 3/2011 | Crespi | H03F 3/217 341/50 |
| 2011/0102486 A1 * | 5/2011 | Tabata | B41J 2/04541 347/10 |
| 2012/0176824 A1 | 7/2012 | Franklin et al. | 363/79 |

(Continued)

FOREIGN PATENT DOCUMENTS

| | | | | |
|---|---|---|---|---|
| EP | 2299577 A1 | 3/2011 | | H02M 3/156 |
| WO | 00/01075 A1 | 1/2000 | | H03M 7/32 |

OTHER PUBLICATIONS

International Search Report and Written Opinion, Application No. PCT/US2014/023049, 10 pages, Oct. 6, 2014.

(Continued)

*Primary Examiner* — Jean B Jeanglaude
(74) *Attorney, Agent, or Firm* — Slayden Grubert Beard PLLC

(57) ABSTRACT

A phase accumulator style circuit generates an output stream of pulses. The density of the pulse stream is proportional to the input data value relative to the maximum value supported by the bit width of an adder. The output pulse density is representative of the desired output voltage. The pulse stream may be filtered with a resistor-capacitor (RC) low pass filter to yield an analog voltage. Faster clock rates support the use of smaller output filters that reduce circuit cost. This circuit provides triangle wave generation wherein the DAC output ramps up and down at a user specified rate (slope) between user specified maximum and minimum amplitude values. The up and down triangle wave ramp rates (up and down slopes) may be different and independent or the same.

24 Claims, 5 Drawing Sheets

(56) References Cited

U.S. PATENT DOCUMENTS

2013/0293401 A1* 11/2013 Werking ............... H03M 3/388
                                                    341/120
2014/0266833 A1* 9/2014 Kris ....................... H03M 1/66
                                                    341/144

OTHER PUBLICATIONS

International Search Report and Written Opinion, Application No. PCT/US2015/059665, 12 pages, Feb. 12, 2016.

"Section 48. Comparator with Blanking," PIC24F Family Reference Manual, Microchip Technology Incorporated, 30 pages, Dec. 1, 2010.

"Comparator with Blanking and Filtering on the dsPIC DSC," Microchip Technology Incorporated, 14 pages, Dec. 31, 2011.

"High-Speed Analog Comparator Module," dsPIC33E/PIC24E Family Reference Manual, Microchip Technology Incorporated, 16 pages, Sep. 1, 2014.

International Search Report and Written Opinion, Application No. PCT/US2015/059676, 17 pages, Mar. 1, 2016.

* cited by examiner

PULSE DENSITY MODULATION DIGITAL-TO-ANALOG CONVERTER WITH TRIANGLE WAVE GENERATION

TECHNICAL FIELD

The present disclosure relates to pulse width modulation (PWM) audio applications, and, more particularly, to a digital-to-analog converter (DAC) comprising slope and pulse density modulation (PDM) generators, blanking and delay logic, and a low pass filter; and that provides triangle wave generation used for converting an analog waveform into a digital PWM train of pulses.

BACKGROUND

All Class D modulation techniques encode information about the audio signal into a stream of pulses. Generally, the pulse widths are linked to the amplitude of the audio signal, and the spectrum of the pulses includes the desired audio. The most common modulation technique is pulse-width modulation (PWM). Conceptually, PWM compares the input audio signal to a triangular or ramping up and down waveform that runs at a fixed carrier frequency. This creates a stream of pulses at the carrier frequency. Within each period of the carrier frequency, the duty ratio of the PWM pulse is proportional to the amplitude of the audio signal. PWM is attractive because it allows 100-dB or better audio-band SNR at PWM carrier frequencies of a few hundred kilohertz, low enough to limit switching losses in the output stage. Also many PWM modulators are stable up to nearly 100 percent modulation, in concept permitting high output power up to the point of overloading. Therefore it is desirable for the amplitude (height) and slope of the triangle wave to be adjusted for optimal performance of the PWM modulator with a given analog input signal.

SUMMARY

Therefore, a need exists for a pulse density modulation (PDM) digital-to-analog converter (DAC) that generates a triangular waveform automatically with parameters, such as ramp rate and voltage levels that may be set by a user in digital logic of the PDM DAC.

According to an embodiment, a pulse density modulated digital-to-analog converter (PDM DAC) with triangle wave generation may comprise: a pulse density modulation (PDM) generator; a low pass filter coupled to an output of the PDM generator; and a triangle wave generator having an output that may be coupled to the PDM generator, wherein the output of the PDM generator may be determined by digital values generated by the triangle wave generator.

According to a further embodiment, the triangle wave generator may generate monotonically increasing digital values until a maximum digital value may be reached then monotonically decreasing digital values until a minimum digital value may be reached. According to a further embodiment, the monotonically increasing digital values may go from the minimum digital value to the maximum digital value, and the monotonically decreasing digital values may go from the maximum digital value to the minimum digital value. According to a further embodiment, the monotonically increasing digital values and the monotonically decreasing digital values may repeat. According to a further embodiment, the maximum digital value may be programmable. According to a further embodiment, the minimum digital value may be programmable. According to a further embodiment, a rate of change of the monotonically increasing digital values may be programmable. According to a further embodiment, a rate of change of the monotonically decreasing digital values may be programmable.

According to a further embodiment, a pulse density from the PDM generator may be proportional to the digital values. According to a further embodiment, an output from the low pass filter may provide an analog triangle wave. According to a further embodiment, a rate of change of the monotonically increasing digital values may determine a positive slope of the analog triangle waveform. According to a further embodiment, the rate of change of the monotonically decreasing digital values may determine a negative slope of the analog triangle waveform. According to a further embodiment, the maximum digital value may determine a maximum amplitude of the analog triangle waveform. According to a further embodiment, the minimum digital value may determine a minimum amplitude of the analog triangle waveform.

According to a further embodiment, the PDM generator may comprise: an accumulator; an increment register; an adder having an output coupled to an input of the accumulator, a first input coupled to an output of the increment register, and a second input coupled to an output of the accumulator; and a flip-flop having an input coupled to a carry output from the adder. According to a further embodiment, the low pass filter may have at least one pole. According to a further embodiment, the low pass filter may comprise at least one resistor and at least one capacitor.

According to a further embodiment, triangle wave generator may comprise: a slope accumulator; a high value comparator coupled to an output of the slope accumulator; a low value comparator coupled to the output of the slope accumulator; an adder; a slope register having an output coupled to an input of the adder; and control logic, wherein the digital values may be provided by the triangle wave generator. According to a further embodiment, a first slope step multiplexer and control logic may be provided for selecting a larger than normal slope value to cause the low pass filter to quickly track a change in slope direction. According to a further embodiment, the PDM generator, low pass filter and triangle wave generator may be provided in a mixed signal integrated circuit. According to a further embodiment, the mixed signal integrated circuit may be a microcontroller. According to a further embodiment, the mixed signal integrated circuit may be selected from the group consisting of a microprocessor, a digital signal processor, an application specific integrated circuit (ASIC), and programmable logic array (PLA).

According to a further embodiment, a system for converting an analog waveform into a pulse width modulation (PWM) pulse train may comprise: an analog comparator having a first input coupled to an analog signal; and a second input coupled to the PDM DAC that may comprise: a pulse density modulation (PDM) generator; a low pass filter coupled to an output of the PDM generator; and a triangle wave generator having an output coupled to the PDM generator, wherein the output of the PDM generator may be determined by digital values generated by the triangle wave generator and an output from the analog comparator may comprise a PWM pulse train representative of the analog signal.

BRIEF DESCRIPTION OF THE DRAWINGS

A more complete understanding of the present disclosure may be acquired by referring to the following description taken in conjunction with the accompanying drawings wherein.

Figure 1:
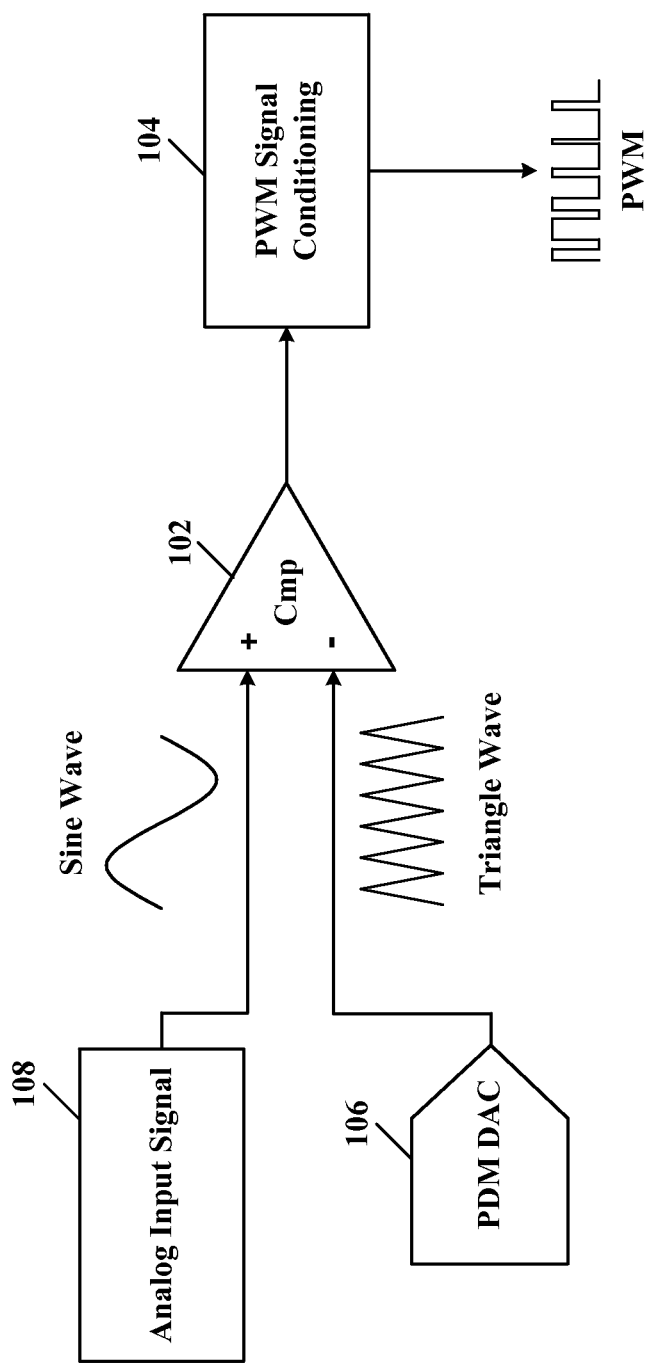
FIG. 1 illustrates a schematic block diagram of a circuit for digital audio PWM applications comprising a PDM DAC with triangle waveform output, a comparator and PWM signal conditioning, according to the teachings of this disclosure.

While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein, but on the contrary, this disclosure is to cover all modifications and equivalents as defined by the appended claims.

DETAILED DESCRIPTION

The PDM DAC with triangle wave generation provides a low cost way to generate triangle wave reference voltages to an analog comparator for generating a digital pulse width modulation (PDM) pulse train representation of the time varying amplitude of an analog signal. The PDM DAC with triangle wave generation is substantially a digital design, so design porting is not an issue when moving to new process technologies. The large digital content thereof scales well with process scaling. "Triangle wave" and "triangle waveform" will be used interchangeable herein. A triangle wave is a non-sinusoidal waveform named for its triangular shape. It is a periodic, piecewise linear, continuous real function. In physics, a wave is a disturbance or oscillation that travels through matter or space, accompanied by a transfer of energy.

According to various embodiments of this disclosure, a phase accumulator style circuit generates an output stream of pulses. The density of the pulse stream is proportional to the input data value relative to the maximum value supported by the bit width of an adder. The output pulse density is representative of the desired output voltage. The pulse stream may be filtered with a resistor-capacitor (RC) low pass filter to yield an analog voltage. Faster clock rates support the use of smaller output filters that reduce circuit cost. This circuit provides triangle wave generation wherein the DAC output ramps up and down at a user specified rate (slope) between user specified maximum and minimum amplitude values. The up and down triangle wave ramp rates (up and down slopes) may be different and independent or the same.

Referring now to the drawings, the details of specific example embodiments are schematically illustrated. Like elements in the drawings will be represented by like numbers, and similar elements will be represented by like numbers with a different lower case letter suffix.

Figure 2:
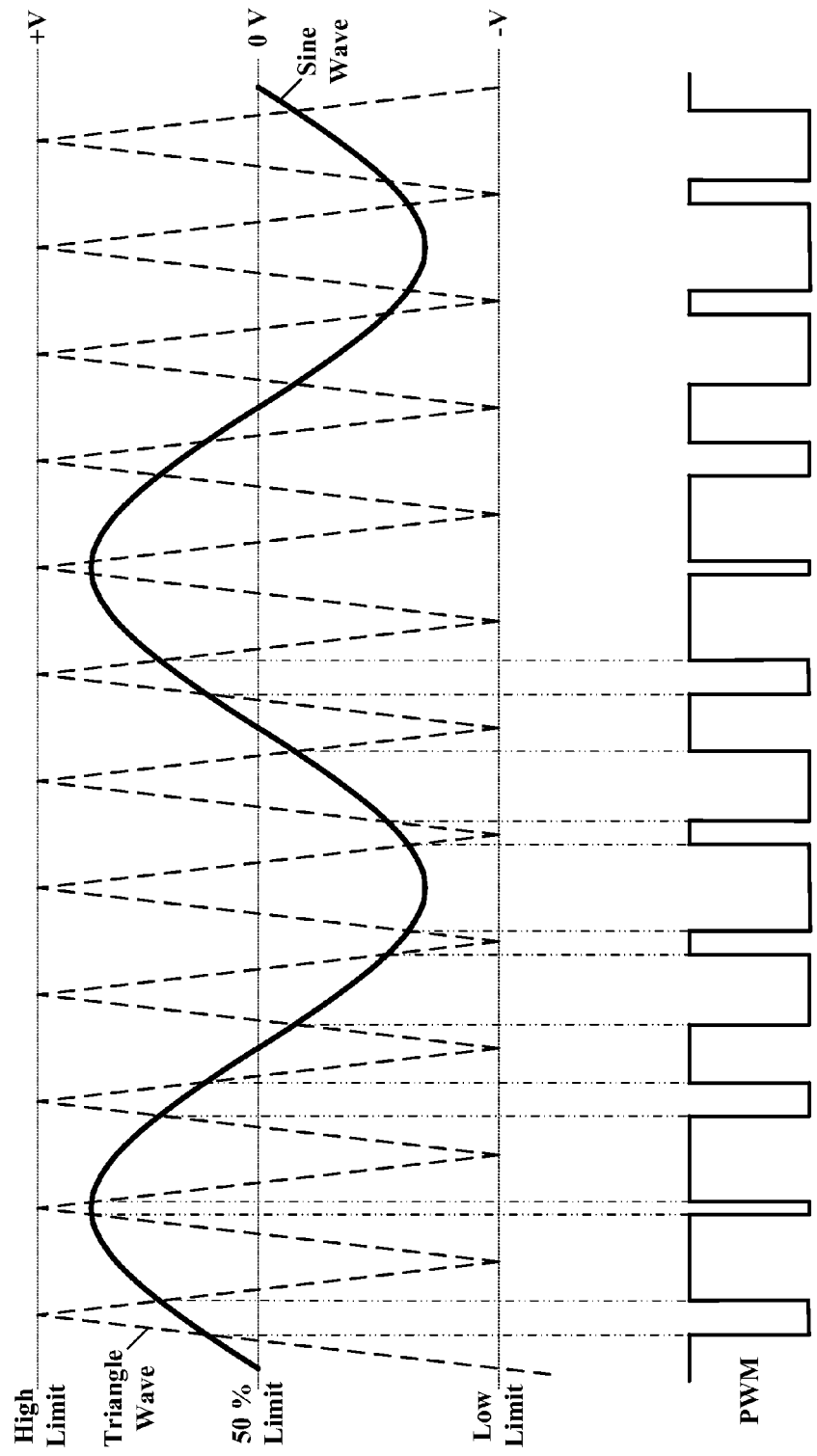
FIG. 2 illustrates schematic graphs showing timing relationships for a triangle wave digital audio PWM application using the circuit shown in FIG. 1, according to the teachings of this disclosure.

Referring to FIG. 1, depicted is a schematic block diagram of a circuit for digital audio PWM applications comprising a PDM DAC with triangle waveform output, a comparator and PWM signal conditioning, according to the teachings of this disclosure. The PDM DAC 106 provides a triangle waveform having a selectable period, high and low amplitudes and ramp up and down (slope) rates, all user selectable. Referring to FIG. 2, depicted are schematic graphs showing timing relationships for a triangle wave digital audio PWM application using the circuit shown in FIG. 1, according to the teachings of this disclosure. In the example shown in FIGS. 1 and 2, the audio input and triangular wave are both centered around 0 volts, so that for an analog audio input at zero (0) volts, the duty ratio of the PWM output pulses is approximately 50 percent. For a large amplitude positive input, it is nearer 100 percent, and for a large amplitude negative input it is nearer zero percent. If the audio amplitude exceeds that of the triangle wave, full modulation occurs (100 percent on or off pulse width), where the pulse train stops switching, and the duty ratio within individual periods is either zero (0) percent or 100 percent.

Figure 3:
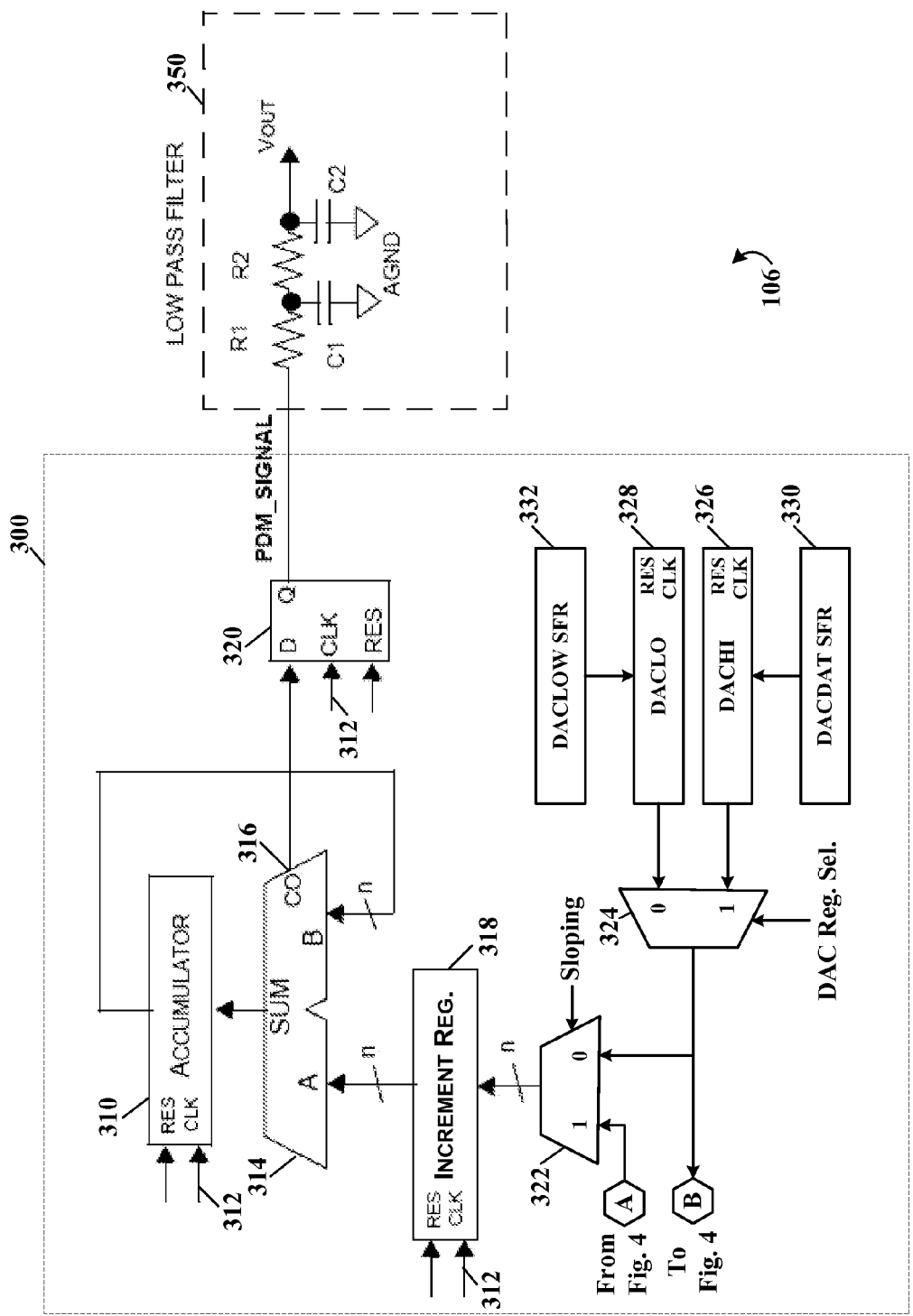
FIG. 3 illustrates a schematic block diagram of a simplified PDM DAC, according to a specific example embodiment of this disclosure.

Referring to FIG. 3, depicted is a schematic block diagram of a simplified PDM DAC, according to a specific example embodiment of this disclosure. The PDM DAC, generally represented by the numeral 106, may comprise a PDM generator 300 and a low pass filter 350. The PDM generator 300 may comprise an accumulator register 310, an increment value (DAC value) register 318, an adder (summer) 314, a first multiplexer 322, a second multiplexer 324, a DAClow SFR register 332, a DACLO register 328, a DACDAT SFR register 330, a DACHI register 326, and a D-latch 320. The adder (summer) 314 generates an overflow carry output (CO) signal 316 having a pulse output at a rate proportional to a value in the increment value register 318. The CO signal 316 is coupled to the D-input of the latch 320. The Q-output of the D-latch 320 may be coupled to a low pass filter, e.g., resistors R1, R2 and capacitors C1 and C2 forming a (RC) low pass filter 330. The low pass filter 330 shown in FIG. 3 is a two pole RC low pass filter, but any type of low pass filter may be used and is contemplated herein.

The accumulator register 310 and the adder 314 constantly add an increment value from the increment value register 318 to an accumulated sum in the adder 314. For non-zero input values, the accumulated sum will eventually overflow, wherein this overflow may be indicated via the CO signal 316 from the adder 314. The rate that the overflow occurs is related to the size of the increment value from the increment value register 318 versus the maximum value that the adder 314 can handle. For example, a 12-bit adder 314 has a maximum output of 0xFFF. If the inputs to the adder 314, the accumulator value and the input value, exceed 0xFFF, then a CO signal 316 is generated. The larger the input value, the more frequently the CO signal 316 may be generated. The resultant pulse stream from the CO signal 316 may then be filtered with a low pass filter 350. The resultant analog output voltage from the low pass filter 350 is proportional to the data input increment value from the increment value register 318. The low pass filter 350 may be the dominant "cost" for the complete PDM DAC 106. Using higher clock rates for the PDM DAC 106 allows the use of smaller components in the low pass filter 350, thus reducing the cost thereof. Higher clock rates also support higher conversion speeds making the PDM DAC 106 useable for a wider range of applications. However, the use of higher clock rates will also increase the current consumption of the PDM DAC 106. It is contemplated and within the scope of this disclosure that any low pass filter circuit design may be used to filter the Q-output of the D-latch 320 to produce an analog voltage signal, and one having ordinary skill in circuit design and the benefit of this disclosure may readily be able to design such a low pass filter circuit.

SFR (Special Function Register) DACLOW 332 and DAC-DAT 330 are input registers that store the desired DAC voltage settings as specified by the user's software. The DACLO 328 and DACHI 326 registers transfer the user's settings from the SFR registers in the processor clock domain to the high speed clock domain of the PDM DAC. Multiplexer 324 selects either the DACLO 328 or the DACHI 326 as specified by the control logic during the rising nor falling portion of the triangle waveform generation. Multiplexer 322 selects either the data from multiplexer 324 or data from the slope accumulator 458. During triangle waveform operation, multiplexer 322 always selects the data from the slope accumulator 458. In triangle wave generation, the data selected by multiplexer 324 is sent to the input of the slope accumulator 458 via the multiplexer 460. The low data from DACLO 328 register is used to initialize the slope accumulator 458 at the start of the upward slope portion of the triangle wave. The high data from DACHI 326 register is used to initialize the slope accumulator 458 at the start of the downward slope portion of the triangle wave.

Figure 4:
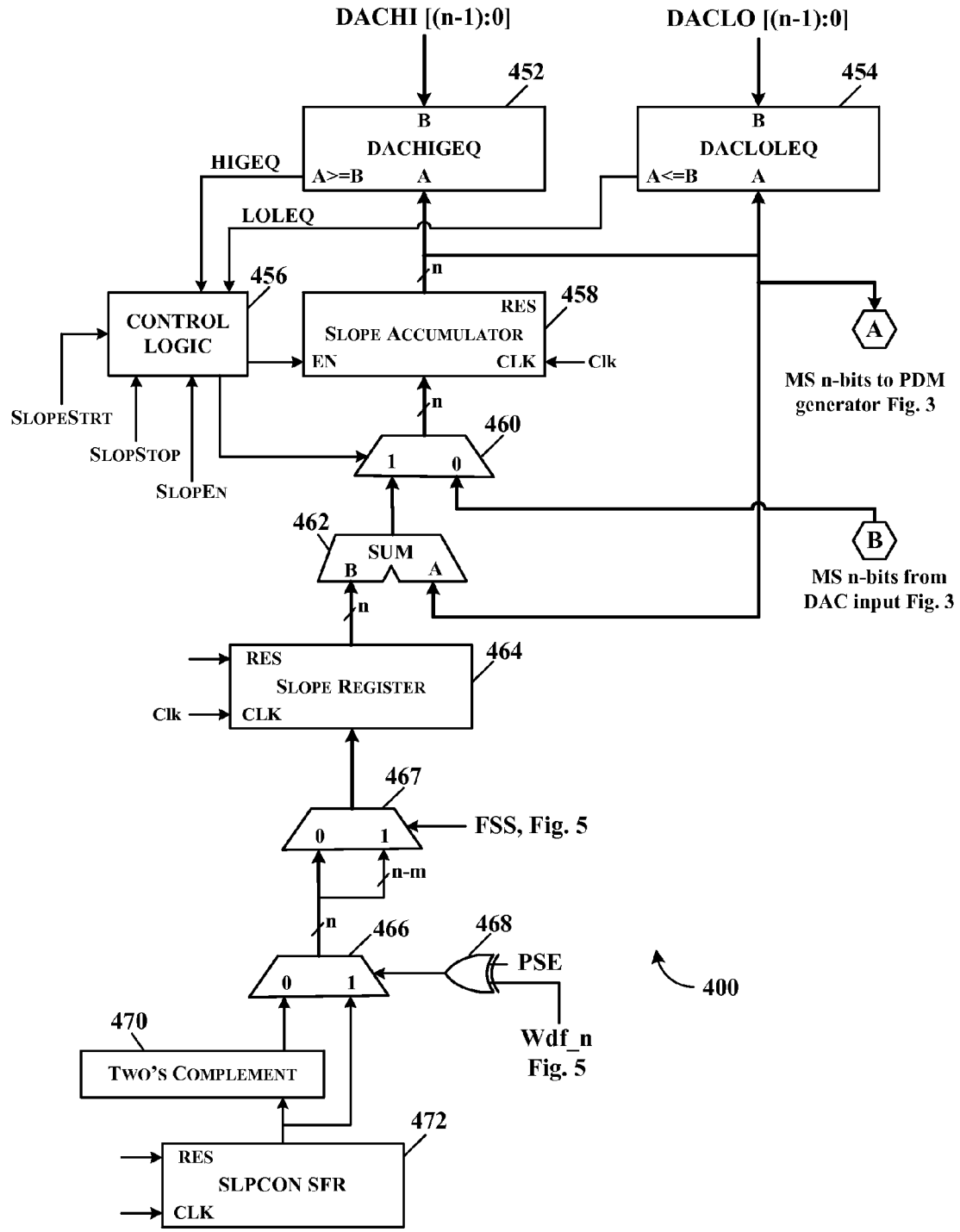
FIG. 4 illustrates a schematic block diagram of a slope generator used in combination with the PDM DAC of FIG. 3 to provide a reoccurring periodic triangle waveform output, according to a specific example embodiment of this disclosure.

Referring to FIG. 4, depicted is a schematic block diagram of a slope generator used in combination with the PDM DAC of FIG. 3 to provide a reoccurring periodic triangle waveform output, according to a specific example embodiment of this disclosure. During periodic triangle waveform generation (triangle wave mode) the input data values to the PDM DAC 106 are repeatedly increased/decreased at a linear, user specified rate until the process is terminated. The triangle wave mode is a repeating cycle of monotonically increasing and decreasing slopes, is auto controlled, and does not rely on external control signals. The triangle wave generator, generally represented by the numeral 400, provides triangle waveform generation wherein the PDM DAC 106 output ramps up and down at a user specified rate between user specified maximum and minimum amplitude values. In the triangular waveform generation mode, the accumulator circuit changes direction to reach the other limit, the slope generator 400 will constantly change between positive and negative slopes.

FIG. 4 shows a circuit that computes intermediate data values to enable the PDM DAC 106 to generate controlled slopes as the PDM DAC 106 moves from one specified value to another. This circuit may operate at one-half the PDM clock generator frequency (e.g., 250 MHz nominal). The slope generator 400, used for generating reoccurring periodic triangle waveforms, may comprise a slope accumulator 458, an adder 462, a slope input register 464, slope equality comparators 452 and 454, a two's complement generator 470, a scaling multiplexer 467, and multiplexers 460 and 466. The function of the slope generator 400 is to increment/decrement the DAC data value at a user defined rate to reach a desired end point value. For triangle wave generation, the slope generator 400 creates the triangle wave function. The slope input data from the user specifies the increment/decrement amount per iteration of the slope circuitry. This circuitry may be, for example but is not limited to, 16-bits wide to provide enough resolution over the expected slope durations and DAC data values. For negative slopes, the slope input value may be converted to a two's complement negative value prior to input to the slope adder 462 so as to support negative slopes.

Figure 5:
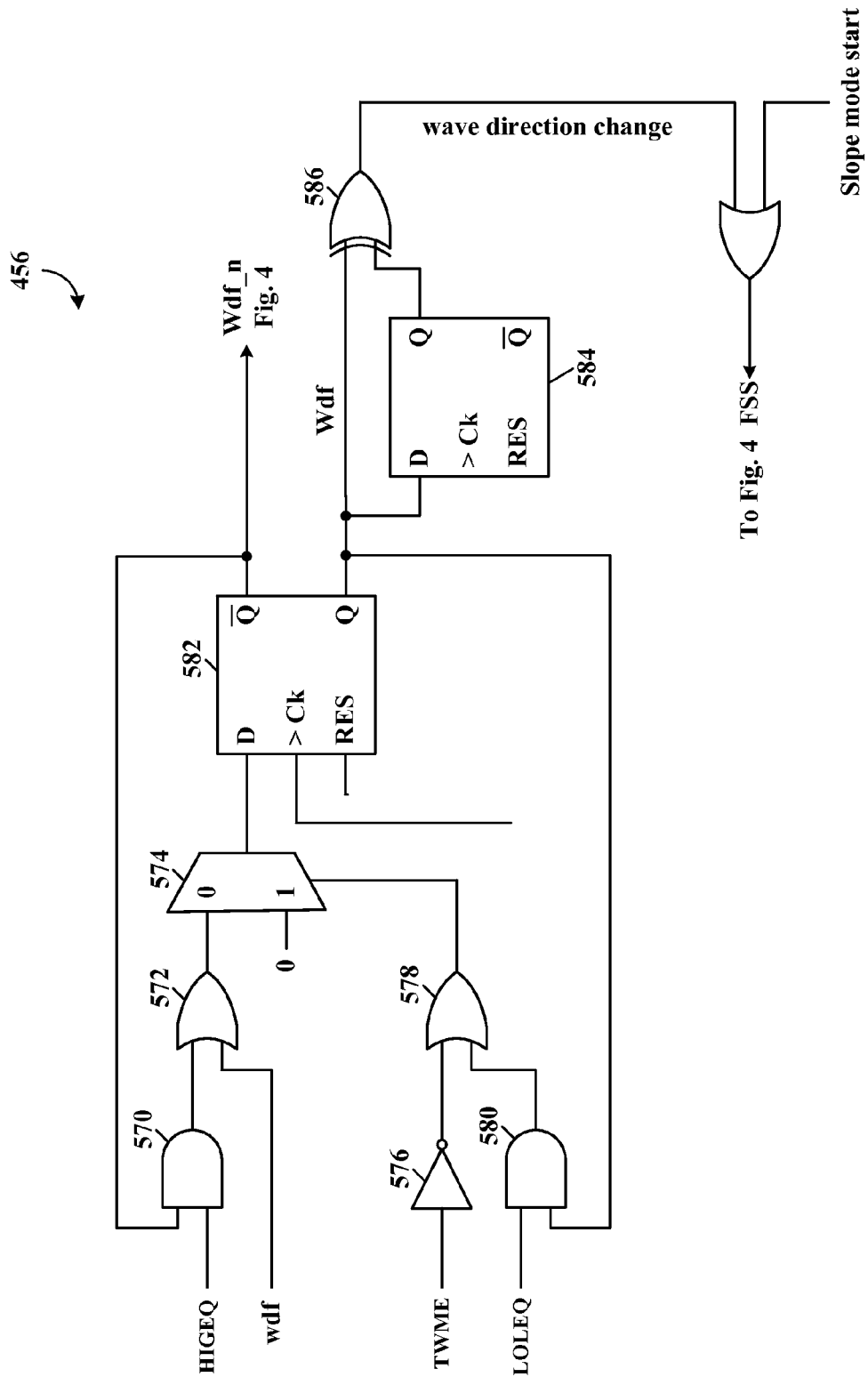
FIG. 5 illustrates a schematic block diagram of triangle wave mode control logic, according to a specific example embodiment of this disclosure.

The control logic 456 has many purposes, but for triangle wave generation, the circuit shown in FIG. 5 (elements 570, 572, 574, 576, 578, 580, 582, 584, 586) is a detailed description of the control logic 456. The control logic defines the direction (upward or downward of the triangle waveform via the wave direction flip-flop 582. The control logic output of the wave direction flip-flop 582 controls whether the slope accumulator 458 will be incremented or decremented via the selection of the true or complement triangle wave slope increment/decrement value via multiplexer 466 and the exclusive OR gate 468. The SLPCON SFR register 472 stores the user's specified positive slope increment rate, while the two's complement circuit 470 generates a negative slope decrement rate. The multiplexer 466 selects either the positive increment value or the negative increment (decrement) based on the output of the wave direction flip-flop 582 in the control logic 456. Multiplexer 467 may be used to provide an initial jump at the start of the slope process to reduce lag in the response of the filter 350. The purpose of the exclusive OR gate 468 is to provide the user the option of overriding (inverting) the polarity of the control circuitry so as to have the triangle waveform go upward instead of downward, and then downward instead of the upward direction. Some applications may want the waveform to start on either a high state or a low state along the triangle waveform.

Referring to FIG. 5, depicted is a schematic block diagram of triangle wave mode control logic, according to a specific example embodiment of this disclosure. The wave direction flip-flop 582 alternates at the completion of each rising or falling edge sequence. The wave direction flip-flop 582 selects the increment/decrement value for the slope generator, and it selects the appropriate digital comparator 452, 454 (FIG. 4) to terminate the slope rising or falling slope. The high and low points of the wave form may be specified via the DACDAT register 330 and the DACLOW register 332 (FIG. 3), respectively. The slope of the triangle waveform may be specified by the SLPDAT register 472 (FIG. 4).

The rise and fall times and the frequency of the triangle wave may be controlled via the SLPCON register 472. The very first clock cycle of the slope process may select a scaled value instead of the specified value to provide prompt DAC response to the DAC trajectory. For all subsequent clocks cycles of the slope process, the slope generator uses the specified data value from the SLPCON register 472 for incrementing/decrementing the DAC data value. The triangle wave mode is useful in digital audio applications where an analog input signals are sampled via an analog comparator using an triangle wave reference signal (see FIG. 1). At application startup: The DAC output voltage is zero. The DAC is enabled (DACON=1), the TWME bit is set (TWME=1), the slope function is enabled (SLOPEN=1. The polarity of the slope may be selected by a PSE signal to an input of the XOR gate 468. The PSE signal may be derived from a bit in the SLPCON register 472.

The Triangle wave function is a "4" step process: The cleared wave direction flip-flop 582 selects the DACDAT register 330 as the slope maximum limit value. The slope direction may be set as positive. The DACHIGEQ digital comparator 452 is selected as the signal to terminate the rising edge portion of the cycle. The slope accumulator 458 increases in value until the output from the DACHIGEQ comparator 452 is asserted. The wave direction flip-flop 582 is set. The wave direction flip-flop 582 selects the DACLO register 328 as the slope minimum limit value. The slope direction is set as negative. The DACLOLEQ comparator 454 is selected as the signal to terminate the falling edge portion of the cycle. The slope accumulator 458 decreases in value until the DACLOLEQ signal is asserted from the DACLOLEQ comparator 454. The wave direction flip-flop 582 is cleared. The cycle repeats. The DACDAT register 330 and DACLO register 328 specify the maximum and the minimum values for the triangle wave form. The DAT register 330 specifies the ramp up and ramp down rates for the triangle waveform.

The FSS signal may be asserted for the first iteration of the slope or ramp process. The FSS signal may then select a larger than normal slope increment/decrement value, e.g., 16×, to provide enough change in DAC voltage to enable the low pass filter 350 to promptly track the desired slope so as to quickly get the analog low pass filter 350 to track the intended slope function. This small step change in DAC value creates a voltage differential that helps the low pass filter 350 to respond. On the first clock cycle of the slope process (including triangle wave segments), a wave direction change signal (FIG. 5) may be asserted from the output of the NOR gate 586. The wave direction change signal may be ORed with the slope mode start signal to generate the FSS (First Step Scaling) signal that controls the scaling multiplexer 467 (FIG. 4).

The wave direction flip-flop 582 is set and cleared as the slope generator 400 passes above the high DAC value in the DACDAT register 330 or below the low DAC value in the DACLOW register 332. The wave direction flip-flop 582 alternates as the slope ramps up to the positive limit and then downward to the negative limit. The cycle repeats as long as triangle wave mode is enabled (TWME=1). To quickly get the analog filter to track the intended slope function, the first cycle of a slope process may use a 16× scaled increment/decrement value (not shown). This small step change in DAC value creates a voltage differential that helps the filter to respond. On the first clock cycle of the slope process, a wave direction change signal is asserted from the output of the Exclusive-OR gate 586.

The aforementioned circuit functions, e.g., PDM generator, low pass filter and triangle wave generator may be provided in a mixed signal integrated circuit, e.g., a microcontroller, a microprocessor, a digital signal processor, an application specific integrated circuit (ASIC), a programmable logic array (PLA) and the like.

Additional background information on a PDM DAC is more fully disclosed in commonly owned U.S. patent application Ser. No. 14/202,420; filed Mar. 10, 2014; entitled "Pulse Density Digital-to-Analog Converter with Slope Compensation Function," by Bryan Kris, Andreas Reiter and Tibor Futo; and is hereby incorporated by reference herein for all purposes.

While embodiments of this disclosure have been depicted, described, and are defined by reference to example embodiments of the disclosure, such references do not imply a limitation on the disclosure, and no such limitation is to be inferred. The subject matter disclosed is capable of considerable modification, alteration, and equivalents in form and function, as will occur to those ordinarily skilled in the pertinent art and having the benefit of this disclosure. The depicted and described embodiments of this disclosure are examples only, and are not exhaustive of the scope of the disclosure.

What is claimed is:

1. A pulse density modulated digital-to-analog converter (PDM DAC) with triangle wave generation, comprising:
   a pulse density modulation (PDM) generator having an input;
   a low pass filter coupled to an output of the PDM generator; and
   a triangle wave generator having an output providing digital values representing a triangle waveform to the input of the PDM generator, wherein an output pulse sequence of the PDM generator is determined by the digital values generated by the triangle wave generator and the low pass filter outputs the triangle waveform.

2. The PDM DAC according to claim 1, wherein the triangle wave generator generates monotonically increasing digital values until a maximum digital value is reached then monotonically decreasing digital values until a minimum digital value is reached.

3. The PDM DAC according to claim 2, wherein the monotonically increasing digital values go from the minimum digital value to the maximum digital value and the monotonically decreasing digital values go from the maximum digital value to the minimum digital value.

4. The PDM DAC according to claim 3, wherein the monotonically increasing digital values and the monotonically decreasing digital values repeat.

5. The PDM DAC according to claim 4, wherein the maximum digital value is programmable.

6. The PDM DAC according to claim 4, wherein the minimum digital value is programmable.

7. The PDM DAC according to claim 4, wherein a rate of change of the monotonically increasing digital values is programmable.

8. The PDM DAC according to claim 4, wherein a rate of change of the monotonically decreasing digital values is programmable.

9. The PDM DAC according to claim 1, wherein a pulse density from the PDM generator is proportional to the digital values.

10. The PDM DAC according to claim 2, wherein an output from the low pass filter provides an analog triangle wave.

11. The PDM DAC according to claim 10, wherein a rate of change of the monotonically increasing digital values determines a positive slope of the analog triangle waveform.

12. The PDM DAC according to claim 10, wherein the rate of change of the monotonically decreasing digital values determines a negative slope of the analog triangle waveform.

13. The PDM DAC according to claim 10, wherein the maximum digital value determines a maximum amplitude of the analog triangle waveform.

14. The PDM DAC according to claim 10, wherein the minimum digital value determines a minimum amplitude of the analog triangle waveform.

15. The PDM DAC according to claim 1, wherein the PDM generator comprises:
   an accumulator;
   an increment register;
   an adder having an output coupled to an input of the accumulator, a first input coupled to an output of the increment register, and a second input coupled to an output of the accumulator; and
   a flip-flop having an input coupled to a carry output from the adder.

16. The PDM DAC according to claim 1, wherein the low pass filter has at least one pole.

17. The PDM DAC according to claim 16, wherein the low pass filter comprises at least one resistor and at least one capacitor.

18. The PDM DAC according to claim 1, wherein the triangle wave generator comprises:
   a slope accumulator;
   a high value comparator coupled to an output of the slope accumulator;
   a low value comparator coupled to the output of the slope accumulator;
   an adder;
   a slope register having an output coupled to an input of the adder; and
   control logic, wherein the digital values are provided by the triangle wave generator.

19. The PDM DAC according to claim 18, further comprising a first slope step multiplexer and control logic for selecting a larger than normal slope value to cause the low pass filter to quickly track a change in slope direction.

20. The PDM DAC according to claim 1, wherein the PDM generator, low pass filter and triangle wave generator are provided in a mixed signal integrated circuit.

21. The PDM DAC according to claim 19, wherein the mixed signal integrated circuit is a microcontroller.

22. The PDM DAC according to claim 19, wherein the mixed signal integrated circuit is selected from the group consisting of a microprocessor, a digital signal processor, an application specific integrated circuit (ASIC), and programmable logic array (PLA).

23. A system for converting an analog waveform into a pulse width modulation (PWM) pulse train, said system comprising:
   an analog comparator having a first input coupled to an analog signal; and
   a second input coupled to the PDM DAC according to claim 1, wherein an output from the analog comparator comprises a PWM pulse train representative of the analog signal.

24. A pulse density modulated digital-to-analog converter (PDM DAC) with triangle wave generation, comprising:
   a pulse density modulation (PDM) generator comprising an accumulator, an increment register, an adder having an output coupled to an input of the accumulator, a first input coupled to an output of the increment register, and a second input coupled to an output of the accumulator; and a flip-flop having an input coupled to a carry output from the adder;
   a low pass filter coupled to an output of the PDM generator; and
   a triangle wave generator comprising a slope accumulator, a high value comparator coupled to an output of the slope accumulator, a low value comparator coupled to the output of the slope accumulator, an adder, a slope register having an output coupled to an input of the adder and control logic, wherein digital values are provided by the triangle wave generator to the increment register of the PDM generator, wherein the output of the PDM generator is determined by the digital values generated by the triangle wave generator.

\* \* \* \* \*